United States Patent
Schrey et al.

(10) Patent No.: US 7,495,202 B2
(45) Date of Patent: Feb. 24, 2009

(54) DEVICE FOR DETECTING ELECTROMAGNETIC RADIATION

(75) Inventors: Olaf Schrey, Ratingen (DE); Ralf Jeremias, Coesfeld (DE); Werner Brockherde, Duisburg (DE); Bedrich Hosticka, Duisburg (DE)

(73) Assignee: Thomson Licensing, Boulogne-Billancourt (FR)

( * ) Notice: Subject to any disclaimer, the term of this patent is extended or adjusted under 35 U.S.C. 154(b) by 451 days.

(21) Appl. No.: 10/560,494

(22) PCT Filed: Mar. 25, 2003

(86) PCT No.: PCT/EP03/03094

§ 371 (c)(1),
(2), (4) Date: Dec. 12, 2005

(87) PCT Pub. No.: WO2004/086087

PCT Pub. Date: Oct. 7, 2004

(65) Prior Publication Data

US 2006/0131483 A1      Jun. 22, 2006

(51) Int. Cl.
*G01J 1/44* (2006.01)
*H01J 40/14* (2006.01)
*H03F 3/08* (2006.01)
*H01L 27/00* (2006.01)

(52) U.S. Cl. ............... 250/214 R; 250/208.1; 348/294

(58) Field of Classification Search ........... 250/214.1, 250/214 R, 208.1; 348/294, 392
See application file for complete search history.

(56) References Cited

U.S. PATENT DOCUMENTS 5,572,074 A * 11/1996 Standley ............... 307/117
6,373,557 B1    4/2002 Mengel et al.

FOREIGN PATENT DOCUMENTS

WO      WO 02/33817      4/2002

OTHER PUBLICATIONS

R. Schwarte et al: "New electrooptical mixing and correlating sensor: facilities and appliIcations of the photonic mixer device (PMD)" Proceedings of the Spie, Bellingham, VA, US, vol. 3100, 1997, pp. 245-253.

(Continued)

*Primary Examiner*—Patrick J. Lee
(74) *Attorney, Agent, or Firm*—Joseph J. Laks; Harvey D. Fried; Joel M. Fogelson

(57) ABSTRACT

The central idea of the present invention is that the resetting of the energy store associated with the receiver prior to every detection interval and/or prior to every exposure period, during which the energy stored in the energy store is to be changed in accordance with the output signal of the receiver so as to use the state of the energy store following the reception interval as information about the object may be avoided by setting the sensitivity of the receiver, which determines the level of the output signal at a specified electromagnetic radiation, higher in at least one instance, and lower in at least one instance between two resetting events, or by varying the sensitivity. The noise contribution provided by the resetting operations is hereby avoided, which is why the benefit of the accumulation and/or integration may be exploited across several reception intervals without this noise contribution.

13 Claims, 6 Drawing Sheets

OTHER PUBLICATIONS

R. Jeremias et al: "A CMOS photosensor array for 3D imaging using pulsed laser" 2001 IEEE International Solid-State Circuits Conference. Digest of Technical Papers, 2001 IEEE International Solid-State Circuits Conference. Digest of Technical Papers, San Francisco, CA USA, Feb. 5-7, 2001, pp. 252-253 and 452.

R. Schwarte: "dynamic 3D-Vision" 2001 International Symposium on Electron Devices for Microwave and Optoelectronic Applications, EDMO 2001 (Cat. No. 01TH8567), Austria, pp. 241-248.

* cited by examiner

DEVICE FOR DETECTING ELECTROMAGNETIC RADIATION

The present invention relates to detecting electromagnetic radiation and/or a receiver structure herefor, and is particularly suited for temporally integrating detection with variable sensitivity, as may be used, for example, for detecting information, such as of a geometrical shape, about an object by means of pulsed electromagnetic radiation.

The applications wherein electromagnetic radiation is to be detected with variable sensitivity are varied. A CMOS camera consists, for example, of a plurality of photo receivers and/or pixels arranged in an array. The photocurrent generated in photodiodes is accumulated by de-charging a pre-charged capacitance. The accumulation can mostly be restricted to accumulation windows of variable length to obtain shorter exposure times for capturing, for example, fast-moving objects, or the like. The ability to be restricted to such time windows is achieved in that a switch couples the constant photocurrent with the capacitance in the accumulation windows only. After each accumulation window, the charge state of the capacitance is read out. Such a CMOS receiver is shown, for example, in R. Jeremias, W. Brockherde, G. Doemens, B. Hosticka, L. Listl and P. Mengel "A COMS photosensor array for 3-D imaging using pulsed laser", Digest of Techn. Papers IEEE international Solid-State Circuits Conf. 2001, Feb. 6-7, 2001, San Francisco, pp. 252-253.

Such CMOS sensors are also used for detecting object information by means of pulsed electromagnetic radiation. They form the core of so-called 3D cameras, or 3D camera systems, which can generate three-dimensional distance images of the object captured by performing capturing with short exposure. One example of such a 3D sensor is described in DE 19757595 A1. FIG. 6 is intended to elucidate the measuring principle of these 3D sensors. Use is made of an opto-electronic CMOS sensor 902, the pixel of which may be read out in a random manner, and the integration time of which may be set on a pixel-by-pixel basis. An optical means 904 images the object 906 to be measured onto sensor 902. Object 906 is illuminated with one or several very short light pulses 910 by a pulsed light source 908, whereupon light pulses of the same length are scattered back from object 906. These scattered-back light pulses are directed to CMOS sensor 902 via optical means 904.

Due to the varying distances between various object points and sensor 902, the scattered-back light pulses corresponding with these object points will arrive at the sensor at different times. For performing a distance measurement, a time-measuring and/or exposure window, the time period of which corresponds to a pre-determinable integration time, is opened at the pixels of sensor 902. Emission times and integration times are controlled and synchronized by a control means 912. The first scattered-back light pulse impinging on sensor 902 will more or less be fully captured if the integration time matches the emission time. The light pulses which impinge in a time-delayed manner due to the larger distance of the object point from the sensor 902 will not be fully captured but cut off at the back. In this manner, the different run times and thus the distances of the respective pixel from its object point may be determined by means of the different charges accumulated in the individual pixels of sensor 902 during the integration times. On this basis, a three-dimensional distance image may be calculated for control and/or evaluation means 912.

Using the above-mentioned measuring principle, depths may be consequently detected in a non-tactile manner by means of a CMOS image sensor system by combining extremely short shutter times with light-pulse run-time methods using, for example, near-infrared (NIR) light, which then leads to a realization of three-dimensional (3D) cameras. It is thus possible, by means of CMOS cameras, to realize not only cameras with intelligent pixels which, apart from standard image-capturing, can also determine the presence of persons by means of movements, or can even track them, but they also offer the possibility of realizing optical depth measurements on the basis of NIR-light run-time measurement, either for certain image areas or entire images. In this manner, it is thus possible to realize 3D CMOS cameras which are able to combine 2D and 3D pictures.

With the method of 3D distance measurement by means of CMOS image sensors, the user is enabled to electronically process three-dimensional image scenes in real time. This results in a multitude of application areas. For example, three-dimensional inspection and placement systems are dependent on obtaining as many items of image information as possible for the purposes of reliable object recognition and classification. In automotive systems, 3D distance measurements might take on monitoring tasks, such as automobile interior identification with intelligent airbag triggering, theft protection, lane identification and early accident detection. However, 3D distance measurement could also simply be used for topography measuring, as is shown in FIG. 6, or for the detection of persons, or as a presence-sensing system. Specifically with intelligent airbag triggering, the camera system must solve the task of, for example, triggering the airbag with delayed intensity as a function of the distance of the passenger. With 3D CMOS image sensors, this is readily possible. On the part of the industry, there is thus a high demand for such intelligent systems, which in turn means a significant market potential for 3D cameras.

Existing 3D CMOS image sensors for distance and/or depth measurement, whose measuring principle was described with reference to FIG. 6, are largely based on the functional principle of the active pixel sensor (APS). As was described above, the temporal opening of the exposure window and/or integration window of the pixel is synchronized with the pulsed triggering of the active scene illumination.

To illustrate this in further detail, FIG. 7 depicts the light intensity curve at light source 908 and at two exemplary pixels of sensor 902 in three graphs arranged one above the other, whose x axes represent the time axes and who are aligned toward one another, and whose y axes indicate the intensity of the pulsed reflected light at the locations of the pixels in random units, and/or indicate the presence of same. In the top graph, two subsequent emitted light pulses 920 and 922 are represented. Synchronized by control 912, an integration and/or exposure window is opened in the pixels of sensor 902 at the same time as the emission and with the same period of time, in which pixels the photocurrent generated in same is accumulated, as is indicated by dashed lines in the two bottom graphs 924 and 926, the center graph indicating the received light at a pixel 1, and the bottom graph indicating the received light at another pixel 2. In the center graph, both reflected light pulses 928 and 930 may be seen, which result at pixel 1 upon pulses 920 and 922. As may be seen from the bottom graph, the reflected light pulses 932 and 934, which result at the other pixel 2, have arrived at sensor 902 only after a bigger run-time difference $t_{D2}$ than the run-time duration $t_{D1}$ at the first pixel 1. The varying overlap of the reflected light pulse at the respective pixel with exposure windows 924 and 926 leads to different accumulated charges at the pixels which are read out at the end of each exposure window 924 and 926, respectively. In particular, the amounts of charge $Q_1$(pulse 1) and $Q_1$(pulse 2) at pixel 1 are larger than the amounts of charge $Q_2$(pulse 1) and $Q_2$(pulse 2) at pixel 2. Immediately before every exposure window 924 and 926, the respective pixel is reset, in the process of which the charge of the respective pixel is pre-set to a reference value, and/or in the process of which the capacitor belonging to the photodiode of the pixel is charged to a predetermined value.

As has been described above with reference to FIG. 6, it should be possible to determine, from the amounts of charge $Q_1$ and $Q_2$, respectively, which, as is known, correspond to the charge carriers generated due to the reflected light pulses, the distances of the respective object point, which is imaged onto the respective pixel, since, as is known, the amount of charge Q essentially linearly depends on the run-time delay $t_{D1}$ and $t_{D2}$, respectively, and the latter, in turn, depends on the distance R under $2R/v_c$, $v_c$ designating the light-propagation speed in the propagation medium and roughly corresponding, with air, to the speed of light c, so that:

$$Q \propto 2R/v_c \qquad \text{eq. 1}$$

However, various problems lead to departures from the theory. For example, there is always a portion of undesired background light that is also detected along with the desired pulse light. In addition, the reflectivity of the objects of the scene also influences the proportion of light scattered back. These factors distort the useful signal, i.e. the amounts of charge $Q_1$ and $Q_2$, respectively, sometimes to a significant extent, depending on the distance of the object. In order to achieve undistorted distance information, corrective measures are therefore required. For normalizing the surface reflection, the above-quoted DE 19757595 A1 suggests performing two captures, i.e. one with the above-described short capturing time, and another one with a sufficiently long capturing time to detect, in the exposure window, the reflected pulses in their entirety, the difference between both captures, divided by the capture with a long exposure, resulting in a normalized distance image. For background light suppression, it is proposed to perform another short-time and long-time measurement, respectively, in addition to the above short-time and long-time measurements, however without illumination, and to deduce these captures from that associated prior to calculating the normalized distance image, respectively.

However, for sufficiently high accuracy it would be absolutely necessary to accumulate and/or integrate entire pulse sequences on the pixel structure in order to achieve a useful signal/noise ratio. After each pulse of the pulse sequence and/or each accumulation period, however, every pixel has had to be reset up to now, i.e. its capacitor has had to be fully loaded by applying a fixed operating voltage to the capacitor and the photodiode. This resetting operation, however, produces a noise contribution which is so considerable that the signal swing obtained by the multiple-pulse sequence is almost fully destroyed, and/or the useful signal is almost fully masked.

It is the object of the present invention to provide a device and a method for detecting electromagnetic radiation, so that a higher level of measurement accuracy is achieved and/or so that a more effective detection is enabled with the same measurement accuracy.

This object is achieved by a device as claimed in claim 1 and by a method as claimed in claim 14.

The central idea of the present invention is that the resetting of the energy store associated with the receiver prior to every detection interval and/or prior to every exposure period, during which the energy stored in the energy store is to be changed in accordance with the output signal of the receiver so as to use the state of the energy store following the reception interval as information about the object may be avoided by setting the sensitivity of the receiver, which determines the level of the output signal at a specified electromagnetic radiation, higher in at least one instance, and lower in at least one instance between two resetting events, or by varying the sensitivity. The noise contribution provided by the resetting operations is hereby avoided, which is why the benefit of the accumulation and/or integration may be exploited across several reception intervals without this noise contribution.

A specific embodiment of the present invention relates to 3D distance and/or depth measurement. An object to be measured is illuminated with pulsed light beams. The object thus illuminated is imaged onto a photodiode array by an optical means. The sensitivity of each photodiode is increased and/or decreased in synchronicity with the light pulse generation by extending and/or decreasing the space-charge region via a variation of the cutoff voltage. A shield covers the space-charge region of each photodiode against the reflected light pulses up to an expansion corresponding to the expansion of the space-charge region in the state of low expansion, so that, in this state, only the diffusion current contributes to the photocurrent. The photocurrent of each photodiode de-charges an associated capacitor as an energy store. Since the drift photocurrent contributes to the photocurrent of the photodiode only in those clock cycles in which the space-charge region expands across the area of the shield, it thereby becomes possible to sum and/or accumulate, in the capacitor, several exposures at subsequent light pulses while varying the sensitivity without having to reset the capacitor between each exposure.

For removing the influence of background light on the photocurrent of the receiver, and thus of the distortion of the information, provided by the device, about the object, two photodiodes, respectively, are combined with each other, in accordance with a further embodiment of the present invention, by connecting them to a different one of two terminals of a controllable voltage source via an associated capacitor in each case. By means of voltage variation, the voltage source provides for a reciprocal and/or opposite change between expansion and reduction of the space-charge region of each of the two photodiodes. The on/off clock of the emission of the radiation pulses is about the same in frequency as a clock with which the space-charge expansion variation is performed. In this manner, the differential voltage between the voltages at the two capacitors within a full space-charge region variation cycle with a period of high sensitivity and a period of low sensitivity at both photodiodes changes by a value which is no longer dependent on the background light and provides information about the distance of the object point imaged roughly onto the two pixels.

In accordance with a further embodiment of the present invention, the control means additionally provides for a reflectance correction mode to be performed alternately with the above capturing mode with the same emission and/or illumination and space-charge region variation and/or exposure clock frequency, wherein which reflectance correction mode the laser light is indeed emitted, or radiated off, on the basis of the same clock and/or with the same pulse periods, but is emitted only once in two instances, whereas the space-charge region variation clock is reduced and/or slowed down by half compared with the capturing mode. The laser emission and space-charge region variation, in turn, are synchronized so that every light pulse reflected fully passes to a pair of photodiodes within a period of time, since the space-charge region of the one photodiode is large and that of the other is small. The value resulting from the difference between the capacitor voltages after one or several complete space-charge region variation cycles may be used as a measure for the reflectance of the object point imaged onto the diode pair, and thus may be used for correcting the object distance to be determined, in order to obtain a normalized distance image.

With reference to the accompanying figures, preferred embodiments of the present invention will be explained below in further detail.

The present invention will be explained below with reference to FIG. 1 by means of embodiments relating to the distance and/or depth measurement in accordance with the principle of FIG. 6. Therefore, reference shall be made to FIG. 6 so as to be able to classify the present invention there, while a repeated explanation of FIG. 6 will be dispensed with, and while it will merely be pointed out, in the following embodiments, where the photodiode structures shown in FIGS. 1 and 2 are used and which differences result.

Figure 1:
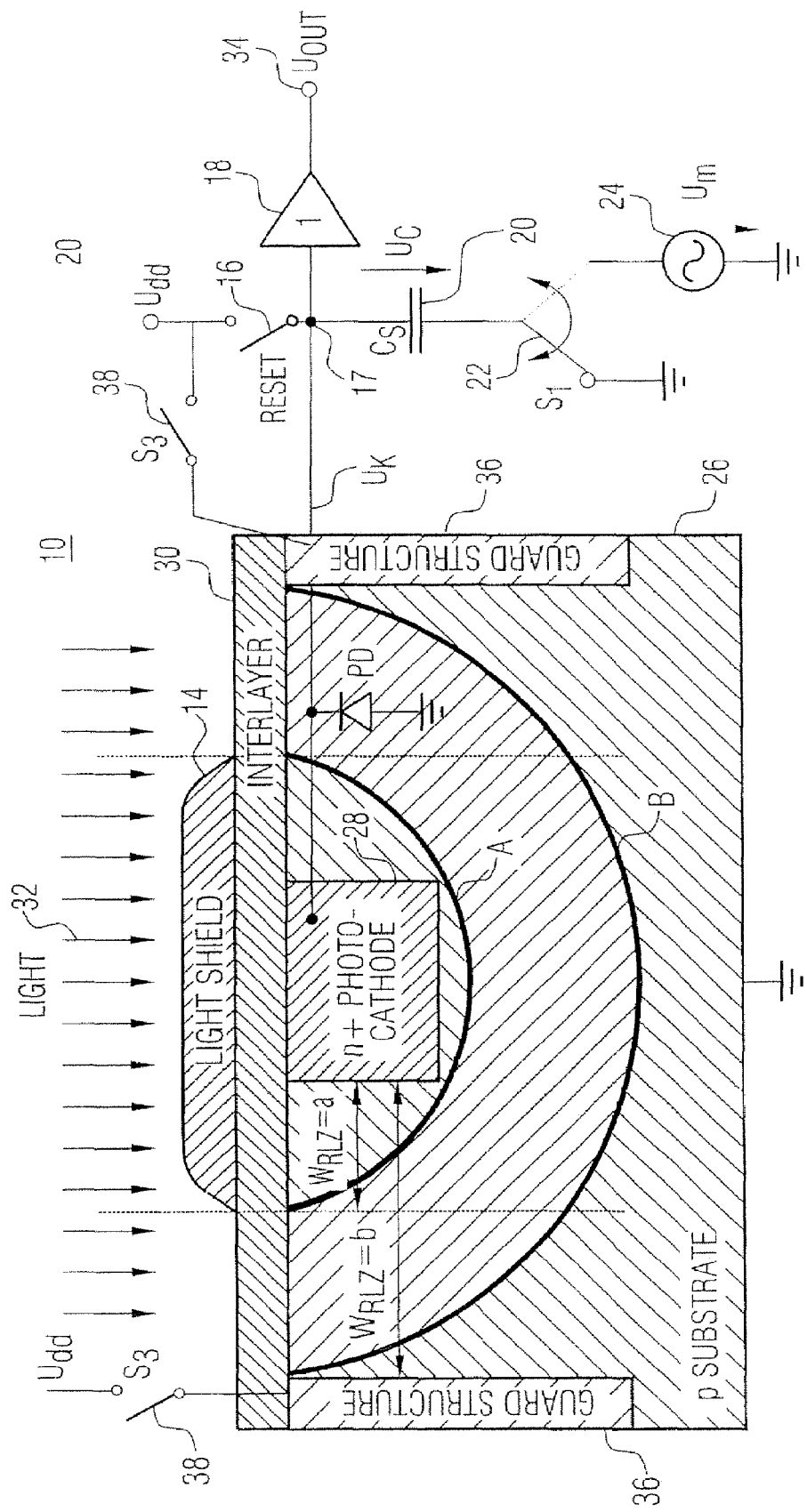
FIG. 1 is a diagrammatic representation of a cross-section of a photodiode with associated wiring in accordance with an embodiment of the present invention.
Figure 2:
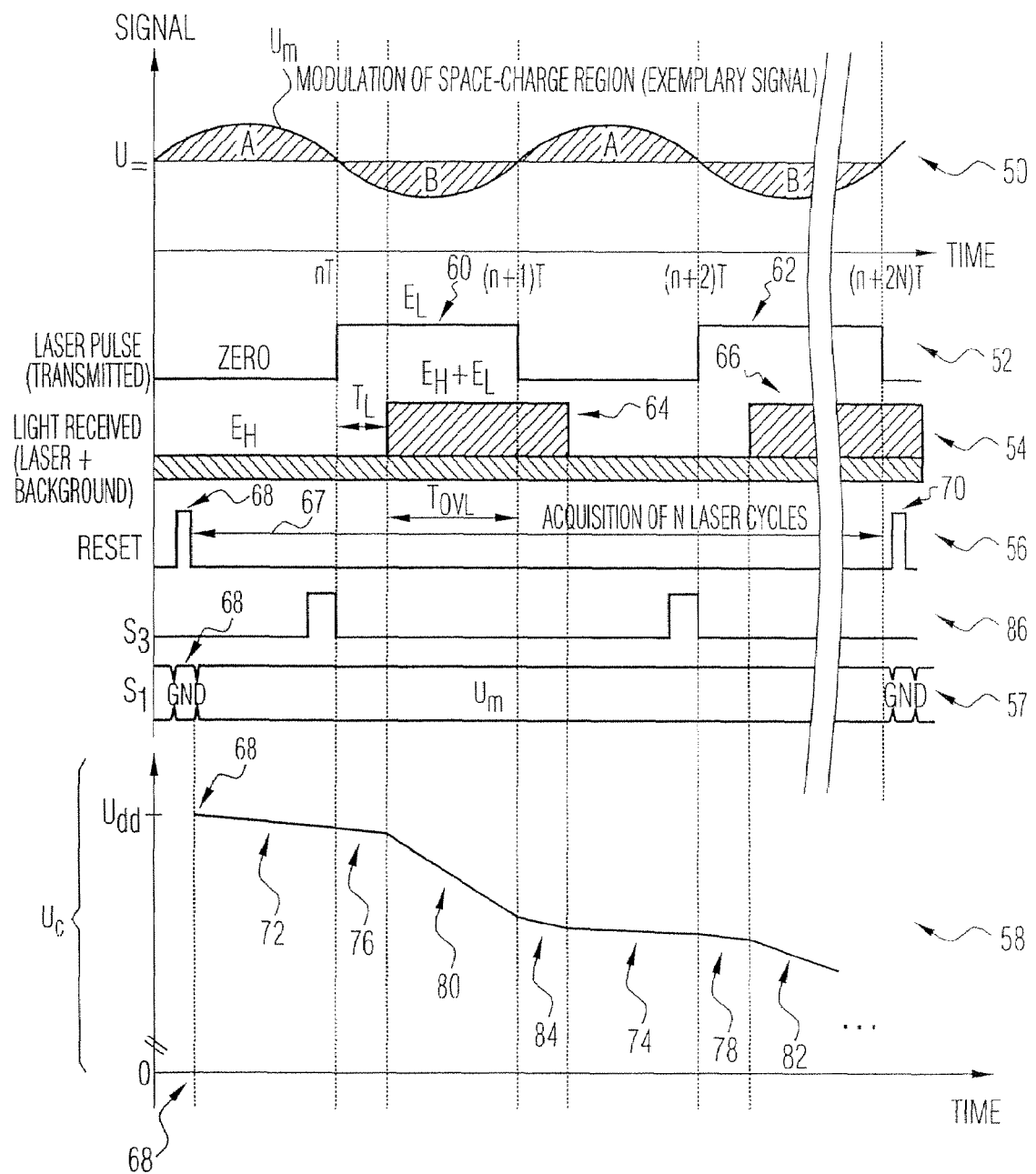
FIG. 2 depicts exemplary time curves, or wave forms, in accordance with an embodiment of the present invention which occur in the receiver structure of FIG. 1.

FIG. 1 shows a photodiode with an associated wiring in accordance with an embodiment of the present invention, the structure shown there being used as a pixel in sensor 902. More specifically, structure 10 of FIG. 1 serves to detect light pulses reflected by the object 906 to be measured which result as a reaction to light pulses 910 with which object 906 is illuminated by the pulsed light source 908, the structure 10, in particular, detecting the reflected light pulses of an object point which is imaged onto a photosensitive area of structure 10 by optical means 904, as will be explained in more detail below. Thus, structure 10 serves to detect distance information about the respective object point of the object 906 to be measured.

Structure 10 includes a photodiode 12, a light shield 14, a reset switch 16, a 1-amplifier 18, a capacitor 20 having a capacitance of $C_s$, a switch 22 as well as a controllable voltage source 24. Photodiode 12 is shown in cross-section, and another time in a schematic representation as PD. As the cross-section shows, photodiode 12 is formed in a p substrate, e.g. a p-doped Si semiconductor substrate 26, in which an n-doped trough area 28 is located as the photocathode of photodiode 12. A semiconductor pn transition, wherein charge carriers may be generated in dependence on the electromagnetic radiation, results at the interface. An interlayer 30 is arranged on the surface of substrate 26, whereon photocathode 28 is formed. Interlayer 30 separates the light shield 14 located above photocathode 28 from photocathode 28. A guard or shielding structure 36, which is connectable with a supply voltage $V_{dd}$ via one or several switches 38 controlled by a signal S3, and is, for example, a trench filled with a conductive material, separates photodiode 12 from neighboring photodiodes and surrounds it so as to extract, in the recovery phase, spurious charge, and/or so as to drain them off to $U_{dd}$, as will be explained in more detail below.

Light shield 14 shields the photocathode 28 from the light 32 reflected from the object 906 to be measured or, generally, from any incident light, and is opaque, whereas interlayer 30 is translucent. The lateral expansion of light shield 14 corresponds to a lateral extension of a space-charge region, as results when photodiode 12 is in a state of low sensitivity, as will be explained below in more detail, the extension of the space-charge region in this case being indicated by "A" in FIG. 1. With higher sensitivity, the space-charge region of the photodiode expands further, its extension in this state of increased sensitivity being indicated by "B" in FIG. 1. Preferably, the guard structure 36 is positioned at location "B" for the purposes of protection from spurious charges.

Photodiode 12 is connected to ground with its anode and/or via the p substrate. Cathode 28 of photodiode 12 is connected, via switch 16, to a node 17 and from there to a supply voltage $U_{dd}$, via a 1-amplifier 18 to an output 34 of the receiver structure 10, where the output voltage $U_{out}$ is applied, and to switch 22 via capacitor 20. Switch 22 either establishes a direct connection of photodiode 12 with ground (solid line) as a reference potential, or a connection to the controllable voltage source 24 which is connected between switch 22 and ground.

With reference to FIG. 2, the mode of operation of receiver structure of FIG. 1 will be explained below when same is used as a pixel in the array 902 of the 3D sensor of FIG. 6, reference still being made to FIGS. 1 and 6 for this purpose.

Figure 6:
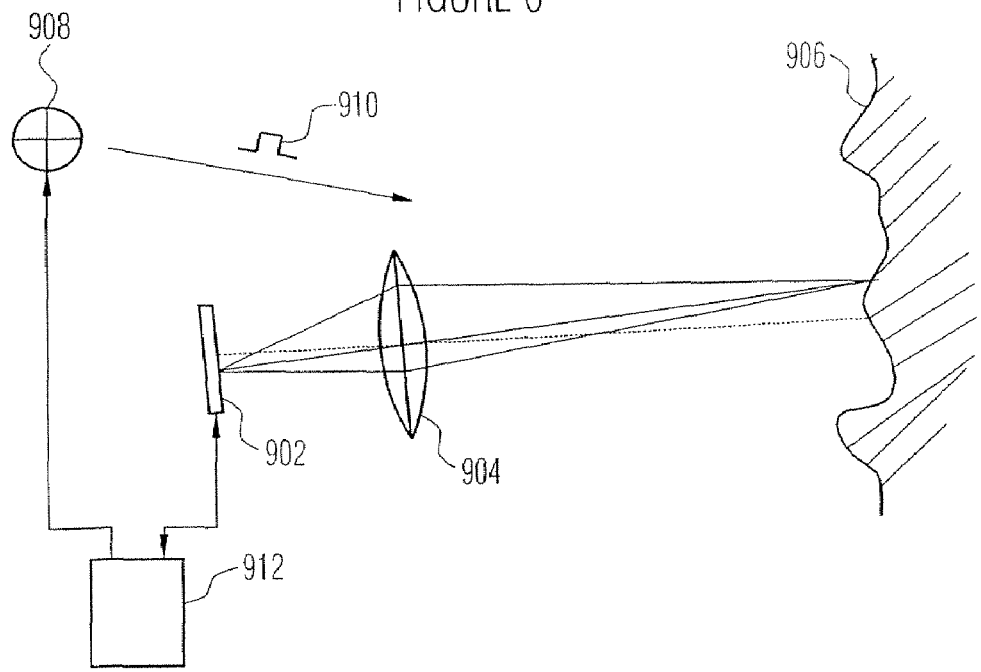
FIG. 6 depicts a diagrammatic drawing for illustrating the principle of the 3D distance measurement by means of pulsed illumination and short exposure time.

FIG. 2 shows, one above the other, exemplary temporal wave forms as they occur, in accordance with an embodiment, in receiver structure 10 of FIG. 1 when used in the 3D sensor of FIG. 6 during a capturing mode for 3D measurement. Time is plotted along the x axes, respectively. The wave forms, which will be designated below, are plotted in random units along the y axes.

At the very top, at 50, the wave form of voltage $U_m$ is indicated, as is generated by the controlled voltage source 24. As may be seen, this voltage, in the present example, is a sine-shaped alternating voltage with a direct component $U_=$ and the repetition time period of 2T. However, it may also take any other form, such as a square-pulse shape. It shall be pointed out, in particular, that FIG. 2 is based on the simplified approach that laser 908 is able to modulate light at random. Indeed, the laser duty cycle, i.e. the ratio between the minimum pulse duration and the minimum repetition interval of the individual laser pulses is typically far less than 50% (as shown) due to the laser recovery times, i.e. even less than 1‰. In this case, this would also have to be accounted for in the duty cycle of modulation signal $U_m$, i.e. $U_m$ would vary in a pulse-like manner within short time periods, with large intervening iteration intervals.

Below, at 52, the pulse operation of light source 908 is depicted, i.e. the energy emitted at light source 908 is plotted versus time, the energy being $E_L$ in transmitting cycles and being zero in non-transmitting cycles. Transmitting cycle, or illumination cycles, and non-transmitting cycles alternate and both have a time duration of T. As may be seen, voltage $U_m$ generated by the voltage source 24, and the intensity of the pulsed light source 908, such as of a laser or a laser diode, are equifrequent and equiphase toward one another. The synchronization necessary for this purpose is conducted, for example, by a corresponding synchronization means within control 912.

At 54, the light energy received at the location of the pixel and/or of reception structure 10 is plotted versus time. As may be seen, the light energy received is composed, in an additive manner, of background light EH and of the energy of the light pulses from light source 908, as have been reflected from object 906 and impinge on pixel 10. As may be seen, the light pulses reflected, indicated at 64 and 66, take a period of time $T_L$ to reach reception structure 10, this period of time corresponding to the distance of the object point of object 906, which is imaged by optical means 904 onto pixel 10, as has already been described in the introduction to the description. The pulse duration of the light pulses reflected equals the pulse duration of the light pulses transmitted, i.e. equals period of time T which in turn corresponds to half the repetition frequency 2T of voltage $U_m$ and/or of laser 908. As may be seen, the period of time during which the laser is switched on, overlap by a period of time of $T_{OVL}$ with the period of time during which the reflected light pulses 64, 66 impinge.

At 56 and 57, the time response of the switching states of switches 16 and 22, and/or the time response of the control switching signals Reset and/or $S_1$, with which same are driven, are depicted, wherein at 16, a high state indicates a closed state and a low state indicates an open state, and at 17, the switching states are indicated by "gnd" for switch 22 connected to ground, and by "$U_m$" for switch 22 connected to voltage source 24. Both control switching signals Reset and $S_1$ are controlled by control means 902, which is also connected to output 34, to evaluate the output signal $U_{out}$ as will be described below, and further controls the controllable voltage source 24. At 58, the time response of capacitor voltage $U_c$ at capacitor 20, which will be further elucidated below, is depicted by way of example.

A description will be given below of how, by means of the receiver structure 1 of FIG. 1, an integration of multiple measurements of the overlap between illumination window 60 and 62, on the one hand, and reception and exposure windows 64 and 66, on the other hand, may be achieved without de-charging the capacitor 20 therebetween, using the synchronized operation between voltage $U_m$ and laser operation.

As may be seen, the capacitor 20 is charged up to supply voltage $U_{dd}$ at the beginning of an acquisition period 67 for acquiring N illumination cycles 64, 66 initially at a time 68 by closing the switch (16) and therefore connecting the one electrode of the capacitor to $U_{dd}$ and connecting the other electrode of capacitor 20 to ground (gnd) by switch 22, as may also be seen at wave form 58. Immediately afterwards, the reset switch 16 is re-opened, and switch 22 is connected to the alternating voltage source 24. This has the effect that now, the voltage at node 17 varies with the alternating voltage $U_m$. As a result, the cutoff voltage across photodiode 12 also changes, so that, depending on voltage $U_m$, the expansion $W_{SCR}$ of the space-charge region changes from $W_{SCR}=a$ in a state of low sensitivity A to expansion $w_{SCR}=b$ in a state of increased sensitivity B, and vice versa, so as to vary between them. This circumstance is illustrated at 50 by "B" and "A".

As is evident from FIG. 1, the photocurrent which discharges capacitor 20 is composed, in an additive manner, of diffusion photocurrent and drift photocurrent in a state B of high sensitivity, the drift photocurrent arising from electron-hole pairs generated by photons which pass light shield 14 and penetrate into that part of the space-charge region which exceeds the lateral expansion of light shield 14 and surrounds same. In the state of lower sensitivity A, the space-charge region extends only below the light shield 14, which is why the photocurrent in this state is only comprised of diffusion photocurrent, since the light is prevented by shield 14 from entering the space-charge region A. Of course, the space-charge region takes any potential intermediate states between states A and B, depending on the sine-shaped voltage $U_m$, and is modulated between the same extreme states.

By modulating the sensitivity of photodiode 12, the acquisition cycle and/or the overall integration interval 67 between the first reset time 68 and a next reset time 70, subsequent thereto, is subdivided, as it were, into exposure time window B of high sensitivity and dead-time window A of low sensitivity. The temporal dependence of voltage $U_c$ across capacitor 20, depicted at 58, is a measure of the accumulation of the charges led off by the photocurrent. At times 72 and 74, during which the sensitivity is low (state A), and no reflected light pulse 64, 66 impinges, voltage $U_c$ decreases only due to the diffusion photocurrent generated by the background light, i.e. in a very shallow manner. At times 76, 78, voltage $U_c$ decreases due to the diffusion and drift photocurrents, as are generated by the background light, i.e. is slightly faster than at times 72, 74. At times 80 and 82, the information actually to be measured, i.e. the photocurrent, consisting of diffusion and drift photocurrents, as are generated by the reflected laser light 64, 66, is detected. In addition, however, the photocurrent, in turn both drift and diffusion photocurrents, contributes to decreasing $U_c$, as is generated by the background light. At times 84, when the sensitivity is low (state A) and the last part of the light pulses reflected impinges, the decrease of $U_c$ in turn is very small, since only the diffusion photocurrent, generated by the light pulses reflected and by the background light, contribute to discharging capacitor 20.

As is evident from the above description, as a result, the actual information from which the overlap of the reflected light pulses with the illumination windows 60 and 62, and/or the run-time $T_L$ and thus, finally, the distance of the object point imaged onto the respective pixel, may be inferred, i.e. the photocurrent caused by $E_L$, is accumulated at times 80 and 82 and hardly distorted at other times 72, 76, 84, 74, 78, since in these times, either the sensitivity is highly reduced or what is captured is only background light with high sensitivity. This process may be repeated for all N illumination cycles during the entire integration time period, without the photodiode 12 and/or the associated capacitor 20 having to be reset prior to each new laser pulse by means of reset switch 16. Thus, the problem—illustrated in the introduction to this description—of spurious noise, as is generated by the resetting, is alleviated, this principle of sensitivity modulation between the reset times also being advantageously applicable with other measuring principles, as will be mentioned at the end of the description of the figures.

Figure 7:
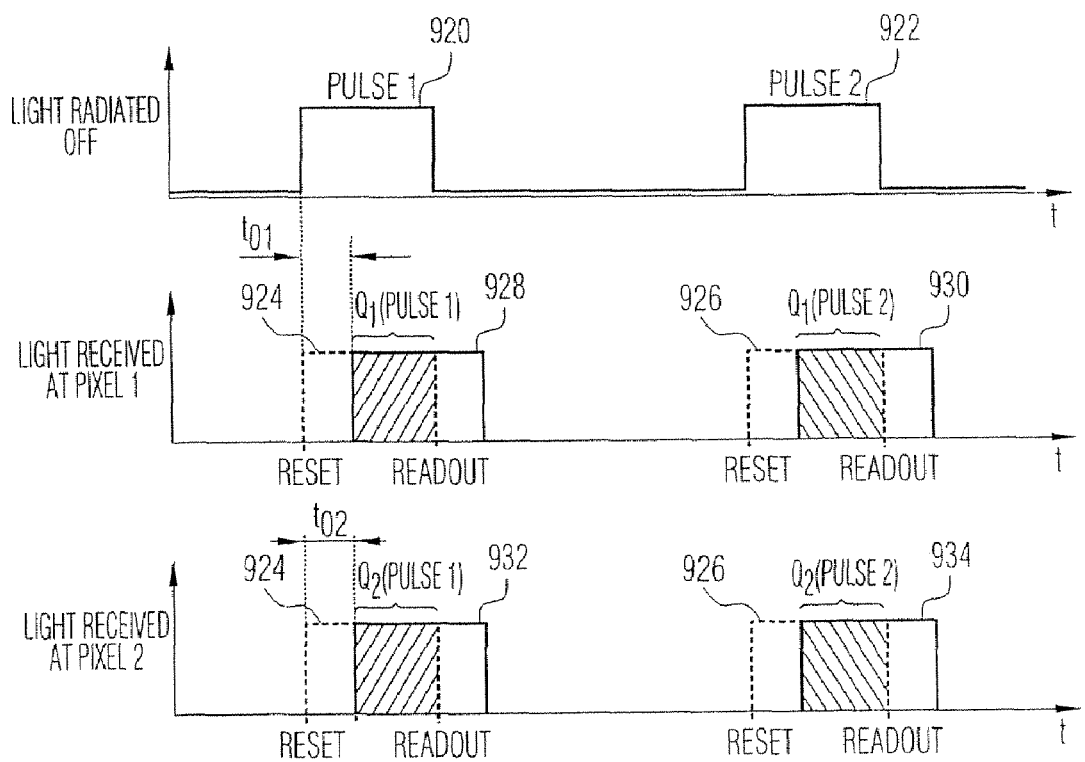
FIG. 7 shows time curves depicting the presence of light at the light source and at two different pixels of the pixel sensor, for illustrating the realization of the measuring principle of FIG. 6 with a conventional CMOS sensor.

After an integration time period 67 over N illumination cycles has ended, the output signal $U_{out}$ at output 34 is evaluated by control means 912, wherein $U_{out}=U_c=U_m$, shortly before reset time 70, which starts the next acquisition cycle. The value of $U_{out}$ is evaluated, for example, at a time when $U_m=U_=$ so that the contribution of $U_=$ is constant or known, or, alternatively, the proportion of $U_m$ in $U_{out}$ is determined in any other manner to obtain $U_c$ from $U_{out}$. The way in which the distance from the object point imaged onto the corresponding pixel is also calculated, at the end of the integration cycle, from the value of $U_c$ becomes obvious in an exemplary manner from the subsequent embodiments, or, alternatively, from the description with reference to FIGS. 6 and 7 in the introduction to the description with regard to the short-time captures.

In addition, at 86, FIG. 2 shows the time response of the switching states of switch 38 and/or the time response of the control switching signal $S_3$, a high state indicating a closed state, and a low state indicating an open state. Via switch 38, signal $S_3$ causes guard structure 36 to be laid periodically onto potential $V_{dd}$ shortly before the transmitting phases 60, 62 of the laser, and thus causes charges which have accumulated during the non-transmitting phases of the laser due to the background light to be extracted in the area of the photodiode, so as to obtain as pure a result as possible in the subsequent integration time periods A. This, in turn, takes into account the circumstance that pulse laser sources currently available on the market are not able to emit pulses within a time raster of about 60 ns, which roughly corresponds to the pulse durations of the individual transmitting pulses and would require modulating the space-charge region in accordance with the example of FIG. 2, which, as one knows, operates on the assumption of a duty cycle of 50%. As has been mentioned, previous lasers have been able to pulse only in the kHz range. This, in turn, corresponds to long recovery times, i.e. non-transmitting phases, wherein background light impinges on photodiode 12. Even though in this case, as has been described above, the duty cycle of the space-charge region modulation $U_m$ is adjusted to the duty cycle of the laser, i.e. the A phase is extended as compared with the B phase, so that the charge carriers already acquired remain on photodiode 12, charges which have been generated by diffusion effects due to the background light arrive at the photodiode and discharge same until it saturates. These spurious charges are extracted by guard structure 36. Of course, a further photodiode, a ground ring or a capacitance may also be used instead of the guard structure described. In addition, a circuit diagram different from that shown at 86 could also be used.

In the previous embodiment of FIGS. 1 and 2, only one photodiode has been used for a pixel. In the subsequent example, which will be described with reference to FIGS. 3 and 4, two photodiodes are combined with each other with a differential technique so as to form a pixel, this embodiment having the advantage over the previous one that the distortion of the useful signal is reduced by the background light. In particular, by evaluating a differentially modulated signal, effects as arise from the direct components of the individual signals are eliminated. Unlike the 3D sensor of DE 19757595 A1 described in the introduction to the description, no pure exposure acquisition cycles are required in which only the background light is detected without illumination.

Figure 3:
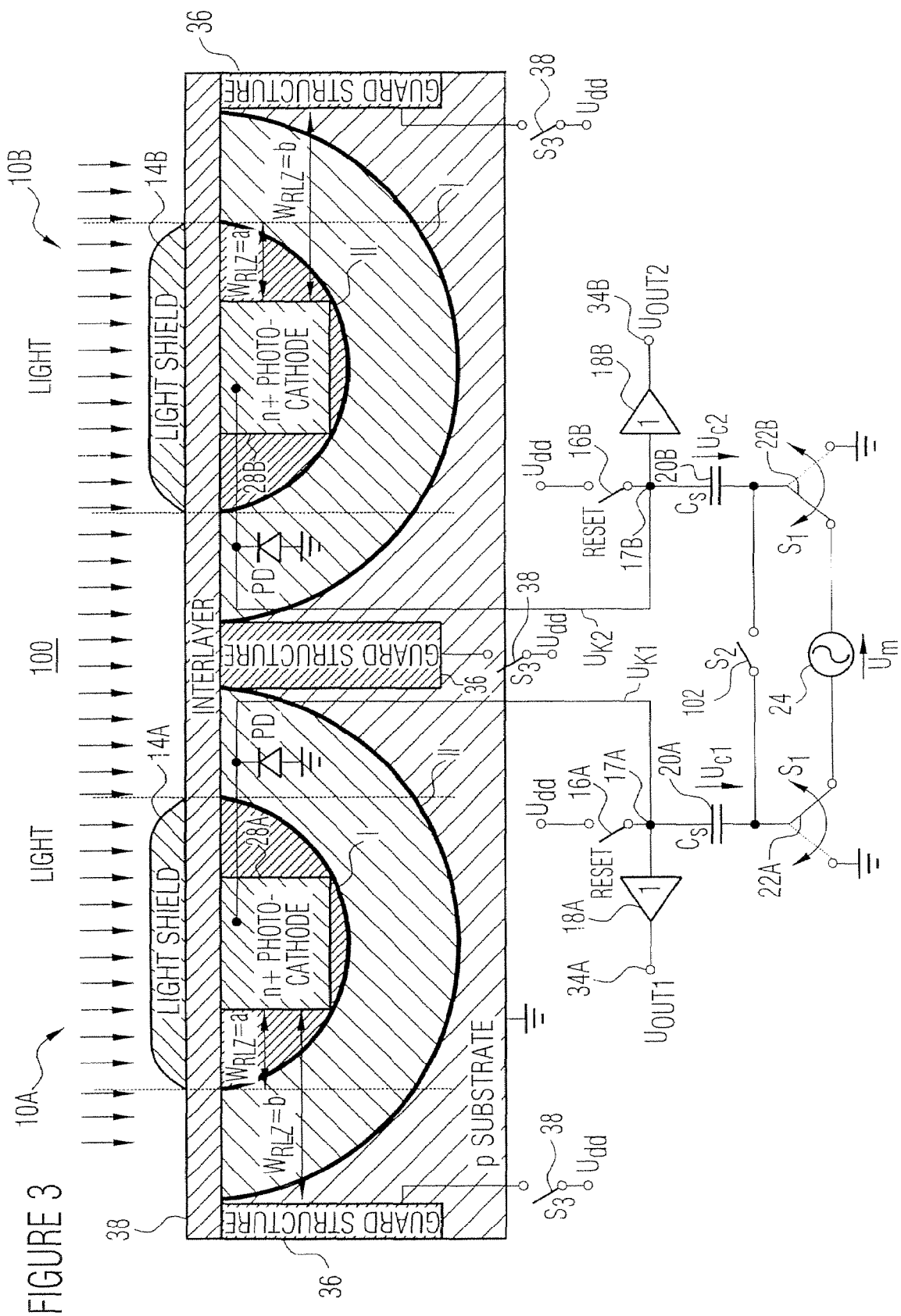
FIG. 3 is a diagrammatic representation of a pair of photodiodes with associated wiring in accordance with a further embodiment of the present invention.

At 100, FIG. 3 generally shows a receiver structure as may serve as a pixel in the pixel array 902 of the 3D sensor of FIG. 6. The receiver structure of FIG. 3 essentially corresponds to a doubling of the architecture of FIG. 1 and consists of a receiver substructure 10a and a further receiver substructure 10b. The receiver substructures 10a and 10b are essentially identical to the receiver structure of FIG. 1, and their components therefore are provided with reference numerals which differ from those of FIG. 1 only by indices a and b, respectively. To put it more precisely, both receiver structures 10a and 10b, respectively, consist of photodiodes 12a and 12b, light shields 14a, 14b, a common guard structure 36 which surrounds and separates photodiodes 12a and 12b and which, during the recovery phase of the laser, extracts spurious charges, and is switchable to the potential $V_{dd}$ via a switch 38 in accordance with a signal $S_3$, reset switches 16a, 16b controlled by a common reset signal, switch nodes 17a, 17b, 1-amplifiers 18a, 18b, capacitors 20a, 20b and switches 22a, 22b controlled by a common signal $S_1$, these elements being wired as described in FIG. 1. With regard to guard structure 38, reference shall be made to what has been said with reference to the previous embodiment. It may consist of several shielding fingers.

Both photodiodes 12a and 12b are formed in a common p substrate 26 and include n-doped photocathode areas 28a, 28b, around which—in two different states I and II, as will be described below—a space-charge region with variable expansion is formed, as is shown by I and II, respectively. While each of the single terminals of switches 22a is connected to ground, as in Fig., each of the other terminals, which may be connected to capacitors 20a and 20b, respectively, by switches 22a, 22b, is connected to a different voltage terminal of a voltage source 24 commonly controlled for the two receiver substructures 10a and 10b. The switches 22a, 22b are controlled by signal $S_1$, such that in the event that signal $S_1$ takes on one of two states (solid line), voltage source 24 is connected between capacitors 20a and 20b so as to apply a voltage difference between same, and in the other of the two possible states (dashed line), one electrode of both capacitors 20a and 20b, respectively, is connected to ground. Switches 16a and 16b are also co-directionally controlled by the reset signal such that, in a state of the reset signal, both switches are open, and in the other state, both switches are closed. In addition, there is a further switch 102 which is controllable by a signal $S_2$ and is connected between those electrodes of capacitors 20a and 20b which either can be connected to ground by switches 22a, 22b, or can be connected to voltage source 24.

After the architecture of receiver structure 100 of FIG. 3 has been described above, the mode of operation of this structure for integration over several exposure cycles will be described below with reference to FIG. 4.

Figure 4:
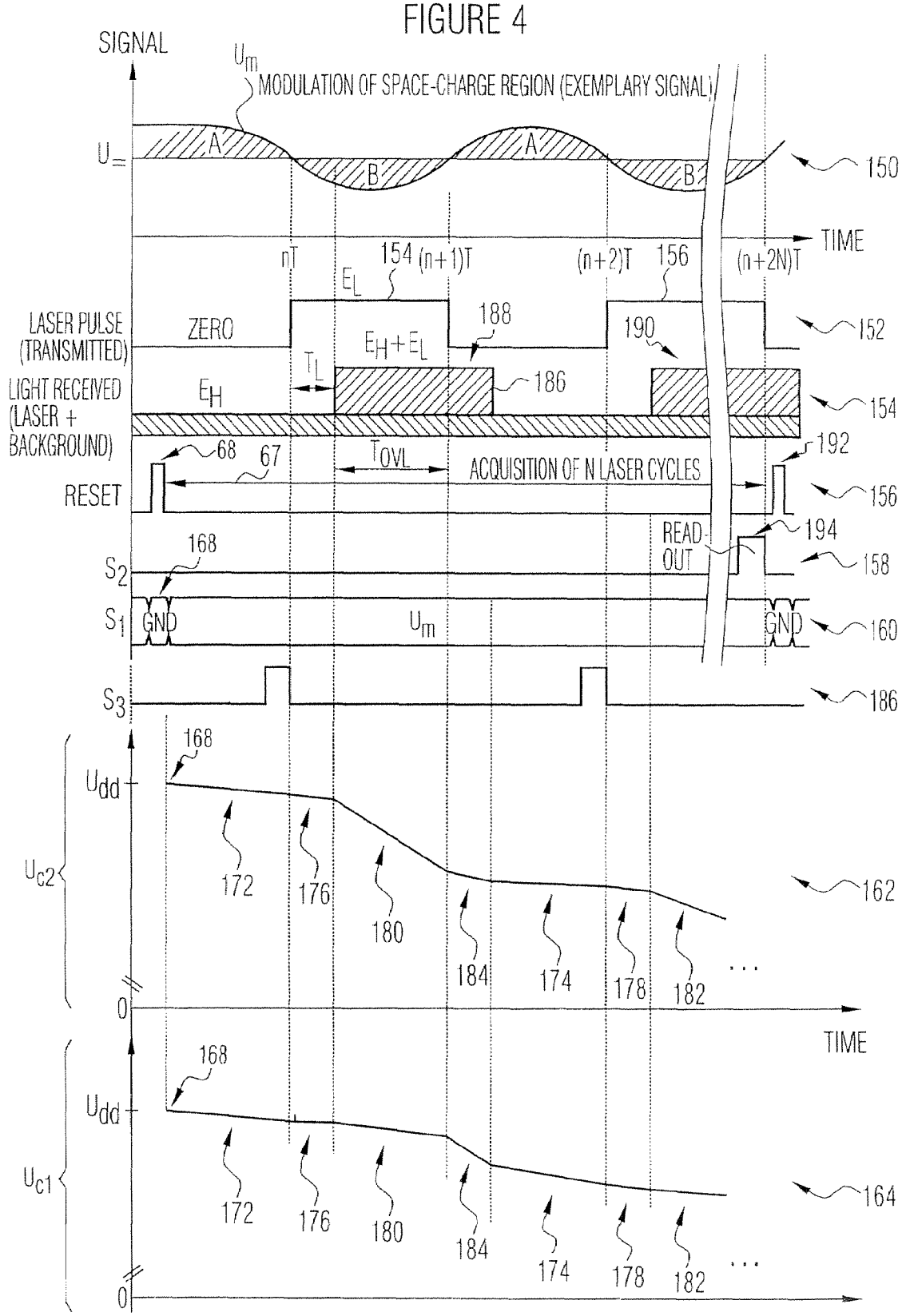
FIG. 4 depicts exemplary wave forms occurring when using the pair of photodiodes of FIG. 3 when using the distance measurement in accordance with the principle of FIGS. 6 and 6 in accordance with an embodiment of the present invention.

FIG. 4 shows several wave forms of signals as they occur in the operation of reception structure 100 of FIG. 3, in the same manner as this was done in FIG. 2. In particular, FIG. 4 shows, at 150, the voltage time curve of $U_m$, i.e. the voltage difference, generated by voltage source 24, at the two voltage terminals of voltage source 24, at 152 it shows the time curve of the light energy at light source 908 with two illumination windows 154 and 156, at 154 it shows the time curve of the light energy at pixel 100, at 156 it shows the time curve of the reset signal for controlling switches 16a and 16b, as is generated by control means 912, at 158 it shows the time curve of the switch control signal $S_2$, as is also generated by control means 912, at 160 it shows the time curve of the switch control signal $S_1$, also generated by control means 912, at 162 it shows the time curve of voltage $U_{c2}$ across capacitor 20b, and at 164 it shows the time curve of voltage $U_{c1}$ across capacitor 20a.

As with the embodiment of FIGS. 1 and 2, by short-time closing of reset switches 16a and 16b and by essentially simultaneous short-time switching of switches 22a, 22b from voltage source 24 to ground and back, capacitors 20a and 20b are initially charged up to the supply voltage $U_{dd}$ at a time 168.

Once reset switches 16a, 16b have re-opened, and switches 22a and 22b have re-connected voltage source 24 between capacitors 20a and 20b, the space-charge regions of the two photodiodes 12a and 12b are alternately modulated to and fro between areas and/or states I and II, which is why they alternately leave the light shields 14a, 14b, respectively, or remain thereunder. As may be seen, the states of the space-charge regions of the two photodiodes 12a and 12b change such that they are precisely complementary and/or opposed to one another, so that the space-charge region of photodiode 12a is at its largest expansion when the space-charge region of photodiode 12b is at its smallest expansion, i.e. in state II. In state I, precisely the opposite is true. The respective states are indicated by Roman FIGS. I and II at 150 in FIG. 4.

At 186, FIG. 4 also shows an exemplary example of a switching example for signal S3, by means of which the common guard structure 36 is controlled via switch 38. The effects are the same as those described in FIG. 2.

Physically, the previously described modulation of the space-charge region expresses itself in a continuous variation of voltages $U_{k1}$ and/or $U_{k2}$ at nodes 10a and 10b, respectively. If, for the node voltages $U_{k1}$ and $U_{k2}$, the analytical approach $U_{k1}=U_=+\Delta U$ and/or $U_{k2}=U_=-\Delta U$ is made with a variable voltage value $\Delta U$, the difference between $U_{k1}$ and $U_{k2}$ provides a differential voltage $U_{diff}=U_{k1}-U_{k2}=2\,\Delta U$, as would be obtained by a differential amplifier, at whose non-inverting input the output signal $U_{out1}$ would be applied, and at whose inverting input the output signal $U_{out2}$ would be applied. The voltage $U_{diff}$ thus is now dependent only on the differential voltage $\Delta U$, which in this structure is given by the drift charges. By modulating $U_m$, the receiver structure 100 may be operated such that $U_{diff}$ contains only portions of the pulsed reflected light which represents the useful signal, i.e. the distance value. At the same time, by means of the formation of the difference, offset effects are suppressed, and the useful signal swing is doubled.

The following mathematical consideration using the pixel structure 100 shown in FIG. 3 in connection with the wave forms, shown in FIG. 4, of the relevant signals, is to illustrate these circumstances.

A mesh circulation of node 17a via 17b back to node 17a provides:

$$U_{c1}+U_m-U_{c2}=U_{out1}-U_{out2} \qquad \text{eq. 2}$$

At the reset time 68, i.e. at the beginning of an acquisition of N exposure cycles, the following applies:

$$U_{c1}=U_{c2}=U_{dd} \qquad \text{eq. 3}$$

Thus, the following applies for the voltage time curves at storage capacitors 20a and 20b, respectively:

$$U_{c1}=U_{dd}-\frac{I_{ph1}\cdot T_{int}}{C_s},\; U_{c2}=U_{dd}-\frac{I_{ph2}\cdot T_{int}}{C_s} \qquad \text{eq. 4}$$

wherein $I_{ph1}$ designates the flowing photocurrent of photodiode 12a, and $I_{ph2}$ designates the flowing photocurrent of photodiode 12b, and changes over time, as will be explained below in more detail, depending on incident reflected light pulses, and is composed, depending on $U_m$, either of drift and diffusion photocurrent, or includes only the diffusion photocurrent. $T_{int}$ refers to the time duration during which the photocurrent generated by the incident light leads to a discharge of the respective capacitor, while it must be noted that equation 4 applies only to short-time periods, since, as is known, the photocurrent is variable, and is otherwise written in a differential manner. The following generally applies for the modulated signal $U_m(t)$:

$$U_m(t)=U_=+U_{mod}(t) \qquad \text{eq. 5}$$

and, in the present embodiment of a sine-shaped modulation $U_m(t)=U_=+U_{amplitude}*\sin(\pi t/T)$. This calculation approach is naturally a simplification, since for the case of the 2-photodiode pixel, as is described here, the same applies, of course, as what has been said with reference to FIGS. 1 and 2 with regard to the duty cycle of the laser and of the modulation signal.

Inserting equations 4 and 5 into 2 provides $$U_=+U_{mod}(t)+\frac{T_{int}}{C_s}\cdot(I_{ph2}-I_{ph1})=U_{out1}-U_{out2} \qquad \text{eq. 6}$$

At times $(n+m)T$, with $m=1\ldots N$ and $n\in\mathbb{N}$, the following thus applies, considering the sine-shaped modulation:

$$U_{out1}-U_{out2}=U_=+\frac{T_{int}}{C_s}\cdot(I_{ph2}-I_{ph1}) \qquad \text{eq. 7}$$

the photocurrents $I_{ph2}$ and $I_{ph1}$ of the two photodiodes 12a, 12b, as has been mentioned above, being variables of time. The modulated portion $U_{mod}$ is zero at these times.

Similar considerations as have been made with reference to FIG. 2 apply to the photocurrents of the two photodiodes 12a and 12b, it having to be noted that in the present example, the states I and II of increased and reduced sensitivity, respectively, of the two photodiodes 12a and 12b alternate such that they are exactly opposed to one another. Due to the alternating voltage by voltage source 24, capacitor 20a, which is charged up to a potential of $U_{dd}$ at time 168, is discharged—at times 172, 174 of the sensitivity state II, since $U_m$ is larger than $U_=$, and of the lack of an incoming light pulse—only by diffusion current generated due to background light, whereas at the same time, capacitor 20b is discharged by diffusion and drift photocurrent as is generated by the background light. At times 176, 178, when state I is present, i.e. $U_m$ is smaller than $U_=$, and no reflected laser pulse impinges, capacitor 20a is discharged both by diffusion and drift photocurrent in photodiode 12a as is generated by the background light, whereas capacitor 20b is discharged only by diffusion photocurrent generated by the background light in photodiode 12b. At times 180, 182, when the reflected light transmitting the actual information impinges during state I, capacitor 20a consequently is discharged by drift and diffusion photocurrent generated both by reflected light pulses and by background light, whereas, on the other hand, photodiode 12b transforms, at reduced sensitivity, background light and useful signal only into diffusion current and hereby discharges capacitor 20b. During the remaining times 184, photodiode 12b transforms the trailing end 186, which projects into states II, of reflected light pulses 188, 190 both into diffusion and drift photocurrent and hereby discharges capacitor 20b, whereas photodiode 12a transforms the useful signal and the background light signal only into diffusion photocurrent and discharges capacitor 20a with same.

On the basis of the simplified assumption that the state changes occur abruptly between states I and II, and that the diffusion photocurrent of photodiodes 12a and 12b is, in state I, about the same as the diffusion photocurrent in state II with the same light incidence, the following applies, when taking into account the above considerations, to photocurrents $I_{ph1}$ in photodiode 12a and $I_{ph2}$ in photodiode 12b in states I and II:

State I→$U_m<U_=$:

$I_{ph1}=I_{diff}$ (only diffusion photo current)

$I_{ph2}=I_{diff}+I_{drift}$ (diffusion plus drift photo current)

State II→$U_m>U_=$:

$I_{ph1}=I_{diff}+I_{drift}$ (diffusion plus drift photo current)

$I_{ph2}=I_{diff}$ (only diffusion photo current) \qquad eq. 8 wherein $T_{int}$ generally indicates the integration time duration.

Thus, the following applies to the change $\delta\Delta U_I$ and $\delta\Delta U_{II}$, respectively, of the differential voltage $\Delta U_I$ and $\Delta U_{II}$, respectively, between two immediately successive points in time (n+m)T, immediately prior to a state I and a state II, respectively, and thereafter:

$$\text{State } I{:}\delta\Delta U_I = +\frac{T_{int}}{C_s} \cdot I_{drift} \qquad \text{eq. 9}$$

$$\text{State } II{:}\delta\Delta U_{II} = -\frac{T_{int}}{C_s} \cdot I_{drift}$$

Consequently, the influence of the diffusion current has been eliminated due to the photodiodes 12a, 12b, which are combined and are operated in an opposing manner, using this value as an output signal, i.e. the difference between $U_{out1}$ and $U_{out2}$.

Due to the distance-dependent run-time $T_L$ of the reflected laser pulses 188, 190, the photo charges accumulated in the states and/or areas I and II, respectively, are different in each case. The following applies to the photocurrents:

$$I_{drift}=I_{ph,drift}=R \cdot E \qquad \text{eq. 10}$$

wherein R corresponds to the responsiveness of the respective photodiode for drift photocurrents, E corresponds to the intensity of the radiation received, and index ph reflects the dependence of the photocurrent on the respective photodiode and/or on the respective pixel.

The intensity of the radiation received is divided up into the background light portion $E_H$ and the laser light portion $E_L$. A differentiation between different cases at times (n+m)T of an acquisition period 2T leads to $$\text{State } I{:}\delta\Delta U_I = \frac{T_{OVL}}{C_s} \cdot R \cdot (E_H + E_L) + \frac{T_L}{C_s} \cdot R \cdot E_H \qquad \text{eq. 11}$$

$$\text{State } II{:}\delta\Delta U_{II} = \frac{T_L}{C_s} \cdot R \cdot (E_H + E_L) - \frac{T_{OVL}}{C_s} \cdot R \cdot E_H$$

The differential voltages and/or charges acquired within time periods I and II result, after each period of a duration T, in a change in the differential voltage $U_{out1}-U_{out2}$ between two points in time (m+n)T and (m+n+2)T of $$\delta\Delta U_I + \delta\Delta U_{II} = \frac{R}{C_s} \cdot (T_{OVL} - T_L) \cdot E_L \qquad \text{eq. 12}$$

After N exposure pulses 188, 190 of the overall time duration 2NT, the evaluating value $U_{out1}-U_{out2}$ of $$\Delta U_{laser} = \qquad \text{Eq. 13}$$

$$\sum_{i=1}^{N}(\Delta U_I + \Delta U_{II})_i \underset{E_L,E_H=const.}{=\!=\!=} U_= + N\frac{R}{C_s} \cdot (T_{OVL} - T_L) \cdot E_L$$

results, it being assumed that the background light, the object position and the intensity of illumination remain constant during the illumination phases.

After a time duration of 2NT, signal $S_2$ is asserted shortly before the next reset time 192 following the time 168, shortly before at a time 194, such that switch 102 is closed, the difference between the voltage values $\Delta U_{laser}$ being read out and, subsequently, the value $\Delta U_{distance}=\Delta U_{laser}-U_=$, corrected by $U_=$, being evaluated at this time that switch 102 is closed. For this evaluated signal, which includes the information about the distance component, the following applies, considering that the time duration of the overlap between the time window of state I and the illumination window 154 and/or 156, i.e. $T_{OVL}$, plus the run-time duration $T_L$, corresponds to period duration T, i.e. $T=t_L+T_{OVL}$:

$$\Delta U_{distance} = \frac{R}{C_s} \cdot N \cdot (T - 2T_L) \cdot E_L \qquad \text{eq. 14}$$

In comparison with the preceding embodiment, the distance signal is thus now dependent only on the useful signal, i.e. the reflected light pulses, whereas the influence of the background light is compensated for as early as during the modulated signal acquisition. The availability of the distance signal is now increased by a factor N, without the distance signal being exposed to additional noise due to constant recharging of the acquisition capacitor. The reset signal had to be asserted only once per integration cycle of the time duration 2NT, and/or the reset switches 16a and 16b had to be closed only once within this time duration. In comparison with the above-mentioned solutions, the noise is improved by the factor N.

It is to be noted that, here, the duty cycle of the laser of about 1%, which is much lower in reality, has been neglected. In reality, the above-mentioned guard structures etc. may be used for adjusting the signal/noise ratio obtained in reality to the value theoretically determined.

Only for completeness' sake shall it be pointed out here that it would also be possible to add up the difference $U-_{out1}-U_{out2}$ between the output signals at any time (n+m)T, and all results, for example in a digital format. The value obtained would be $$\Delta U_{laser} = 2NU_= + N\frac{R}{C_s} \cdot (T_{OVL} - T_L) \cdot E_L \qquad \text{eq. 15}$$

and, with appropriate correction, would result in a signal to be evaluated as in eq. 14.

In the following, with reference to FIG. 5, a control mode of control means 912 will be described, wherein control 912 controls the pixels and the light source such that a correction image is obtained with regard to the distance image ($U_{distance}$) which was previously described with reference to FIG. 4 and will subsequently be referred to as capturing mode. In particular, the control means 912 controls the pixel structure of FIG. 3 in the correction mode such that information about the reflectances of the object points and/or of that object point, corresponding to the pixel, which is imaged onto same is determined. This correction mode alternates, for example, with the above-described capturing mode and takes into account the circumstance that the degree to which the capacitors of the receiver structure are discharged depends not only on the run-time difference and/or the degree of overlap between illumination and exposure time windows, but also on the reflectance r and/or on the fraction of reflected pulsed light, and that, thus, a back-calculation from the distance image determined in the distance mode would be distorted.

The amount of light reflected is thus $r^*E_L$ instead of simply being $E_L$. Consequently, the following applies instead of equation 13

$$\Delta U_{distance} = \frac{R}{C_s} \cdot N \cdot (T_{OVL} - T_L) \cdot r \cdot E_L \qquad \text{eq. 16}$$

In this correction cycle, control means 912 controls light source 908 such that same radiates light pulses 910 of the same light duration, i.e. T, but with a double repetition time duration, i.e. 4T instead of 2T (duty cycle of 25%). In addition, the repetition frequency of the alternating voltage is reduced by half to a repetition time duration of T by the current source 24 (duty cycle is still 50%). Again, reference is made to the simplified representation and the fact that the laser/modulation duty cycle that is possible in reality so far is much lower. However, the following considerations may readily be transferred also to the above cases.

Figure 5:
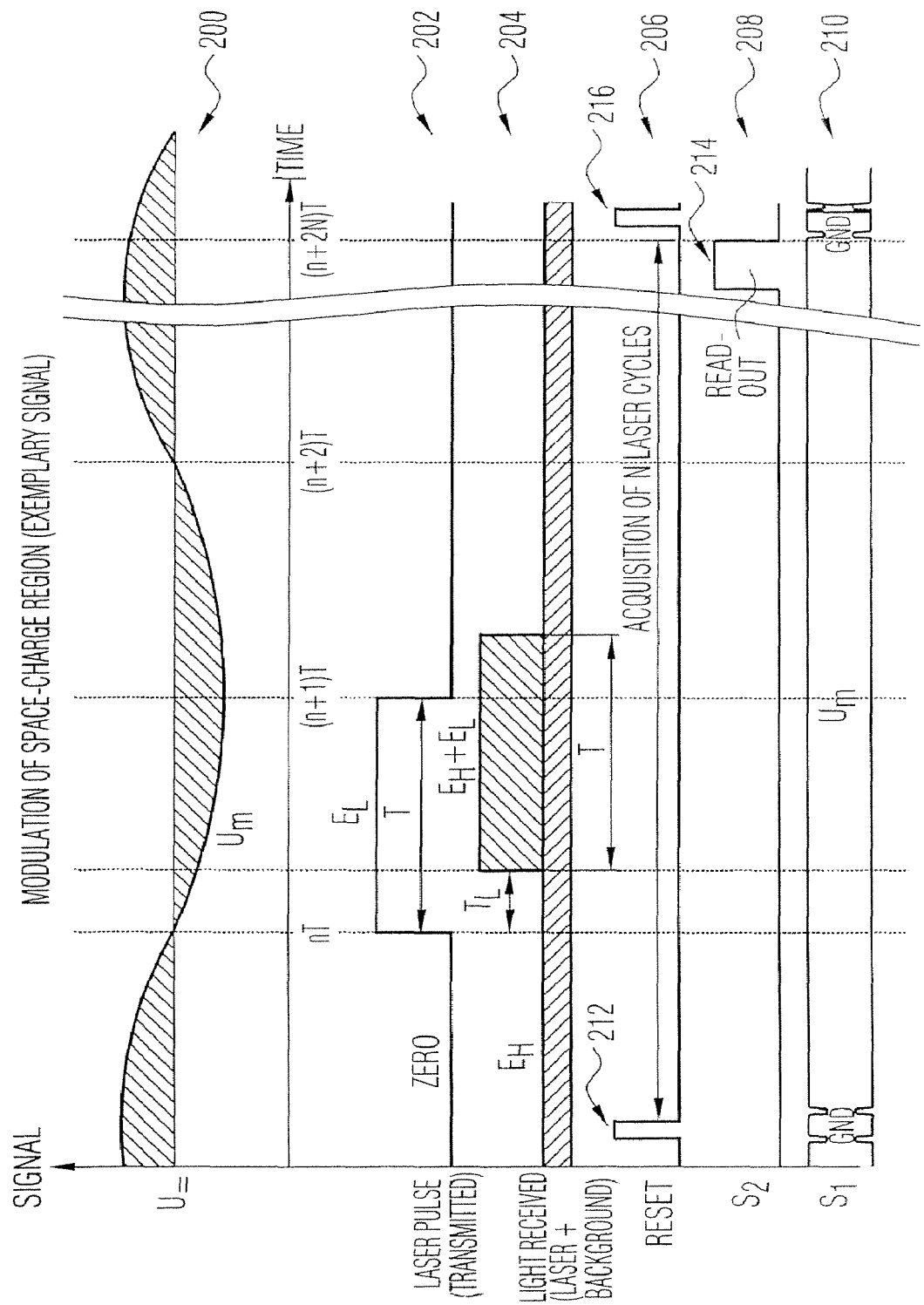
FIG. 5 shows exemplary wave forms occurring with the pair of photodiodes of FIG. 3 in a reflectance correction mode in accordance with an embodiment of the present invention.

In FIG. 5, an exemplary time curve of alternating voltage $U_m$ is shown at 200, an exemplary time curve of the light energy at light source 908 is shown at 202, an exemplary, resulting time curve of the light energy at the location of the receiver structure 100 is shown at 204, an exemplary wave form of the reset signal is shown at 206, an exemplary wave form of the $S_2$ signal is shown at 208, and an exemplary wave form of the $S_1$ signal is shown at 210. As may be seen, the reflected light pulses temporally fully overlap with the states I, since $U_m < U_=$. No reflected light pulses impinge at states II.

Like the acquisition cycles described above with reference to FIGS. 2 and 4, a correction mode starts, in the capturing mode, with a reset time 212 in each case, since reset switches 16a, 16b are closed for a short time and switches 22a and 22b are connected to ground for a short time. After N exposure pulses have occurred, values $U_{out1}$ and $U_{out2}$ are read out at a time 214 prior to a next reset time 216, and the difference of both values is used as a measure for reflectance, the following resulting for the difference read out at time 214:

$$\Delta U_{correction} = \frac{R}{C_s} \cdot N \cdot T \cdot r \cdot E_L \qquad \text{eq. 17}$$

This measurement, which indicates reflectance, may now be used to obtain, together with the value detected in eq. 14 in the acquisition cycle described with reference to FIG. 4, by means of forming quotients, a measure $d_{comp}$ for that distance of a scene image point from the detection structure, onto which said point is imaged, which is proportional to distance $d_{real}$ from the object point imaged onto the pixel:

$$d_{comp} = \frac{\Delta U_{distance} - \Delta U_{correction}}{\Delta U_{correction}} = \frac{2T_L}{T} \propto 2d_{real} \qquad \text{eq. 18}$$

The method described here is only exemplary. Other procedures may also result in obtaining the distance measure. Making use of the possibility of reading out the intermediate result $U_{out1} - U_{out2}$, one can pulse (light source 906 switched on) at times (n+m)T in a manner alternating with T, 3T, 5T . . . (2m+1>N)T, read out the background value in a manner alternating with 2T, 4T, . . . , (2m<N)T (light source 906 switched off), perform the reflectance compensation precisely at times 2T, 4T, . . . , (2m <N)T, and read out and accumulate the reflectance-compensated values. The advantage would be improved correlation of laser and background fractions due to the increased temporal proximity of the measurement values placed into correlation with one another.

It is to be stated that it is only the architecture, described herein, of the differential photo modulator that opens up the possibility of obtaining a distance measure that is largely free from interfering effects and, at the same time, is low in noise.

Beyond the differential photon modulator of FIGS. 3-5 shown herein, far more complex architectures are possible which use a lot more pixels and a more complicated modulation scheme.

The embodiments shown may be developed further in almost any desired manner. By integrating n individual photon modulators as in FIG. 1, n-phase decoder architectures may be built. Likewise, a photon modulator of FIGS. 1 or 3 may be arranged in any matrixed form. To reduce the complexity of the pixel and achieve accordingly high filling factors, an additional switch would be provided, for example, at node 17 (FIG. 1), the switch separating photodiode PD from the remaining circuit. This switch is optional. After N*T acquisition cycles, respectively, it generates, on a row-by-row manner, for example a "high", or logically high, signal at the same time as S3 (FIG. 2). For the sake of clarity, it is not shown in the drawings.

In addition, the above-described 3D measurement methods, by means of which the embodiments for pixel structures and/or photon modulators have been described, may also be realized with continuous—non-pulsed—light.

In fields of application remote from 3D distance measurement, the photon modulator may also be advantageously used, e.g. as standard image capturing with CCD/CMOS image sensors for increasing the level of accuracy of detecting the brightness/exposure of the individual pixels, or as a sensor for detecting the refractive index of a sample substance in a container of a predetermined thickness, since the refractive index determines the optical path length which could be determined just like the distance above. The photon modulator may also be used for demodulating microwaves/radio signals. Then it acts as a demodulation unit for electromagnetic waves with accordingly higher clock rates and with the use of suitable technologies. The areas of application are varied, and the invention is advantageous wherever the detection of electromagnetic radiation is required over a detection period, however with varying sensitivity.

In particular, the invention is advantageous for detecting periodically modulated electromagnetic radiation when the radiation intensity detected is to be accumulated mainly in periodically recurring, temporally spaced-apart integration time periods. With essentially identical periodicity, a phase difference between radiation and integration time periods may be inferred from the accumulation result, and further or, immediately, other quantities, such as an optical path length or the distance, may be inferred from the phase difference, as has been the case in the above embodiments. Here, the present invention is advantageous, as has been mentioned above, particularly with integration over several integration time periods, since the advantage, resulting herefrom, of the improved signal/noise ratio is not diminished by noise fractions caused by intermediate reset operations of the energy store performing the integration, in the above case of the capacitance. However, it shall be pointed out that even reading out the energy store would be possible at any time between two reset operations, such as, for example, after each integration time period. In this manner, a camera with an improved signal/noise ratio may be obtained, since not every instance of image capturing gives rise to noise fractions due to reset operations.

Thus, the preceding embodiments provide a novel principle for photon detection by modulating the efficiency of the signal pick-up, and, more precisely, by modulating the photoreceiver synchronously with a irradiation signal. Guard structures around each photoreceiver which are able to do so, extract spurious charges arising due to background light accumulated during the laser recovery time, so that the influence of the background light, which could otherwise exceed that of the useful light by a factor of 1,000-10,000 since the laser duty cycle in reality is only in the per-thousand range, is clearly alleviated. In other words, the above embodiments provided a device for detecting information about an object interacting with modulated electromagnetic radiation. The device included a receiver which, depending on a modulated electromagnetic radiation interacting with the object, outputs an output signal, a means for varying a sensitivity of the receiver, a means which places the receiver into a state insensitive toward interfering electromagnetic radiation, an energy store which is connected to the receiver and whose stored energy is variable by the output signal, as well as a control means for periodically resetting the energy store to a predetermined reference energy value, and for controlling the means for varying the sensitivity such that the sensitivity of at least two separate time periods is high between two successive resetting events, and is low between the two time durations, a state of the energy store providing information about the object prior to the resetting event.

The principles of these embodiments, however, are also applicable to non-photon-based sensor signal evaluation systems. Moreover, the light shield could be omitted. Also, the above embodiments may be realized in any technology, such as CMOS, BICMOS, CCD, Bipolar, SIMOX, etc.

The 3D measurement described as exemplary application environment does not necessarily presume the synchronicity between the light modulator and the light source pulses, but may also be configured in an asynchronous manner. Non-locked phase relationships and different temporal widths between the modulator and the radiation source may be realized in an unlimited manner, i.e. not mutually phase-locked and/or laser/shutter time windows of non-equal lengths. Laser/shutter time windows which are out of phase for individual cycles, i.e. phase positions which are offset toward one another per acquisition cycle, could be deliberately used, for example, by a suitable evaluation algorithm to determine the distance to be determined from the optimum phase position and/or from the phase shift resulting therefrom. The shutter window or the laser window would be shifted by a defined time interval from cycle to cycle, in which situation the evaluation algorithm would determine the distance from the shifting information which results, for example, until the phase position between the shutter/laser window is zero.

In addition, read-out circuits other than the above-shown possibility of switch S1, reset switch, "1"-amplifier and guard structure are also possible.

Thus, by means of the above embodiments, a detection principle and a detector structure which resets the pixel and/or the receiver only once at the beginning of a pulse sequence have been successfully developed, the principle generally being transferable to a modulated signal acquisition, since it may also be employed in areas of application remote from 3D distance measurement.

Improvements over the prior art which have been achieved by the modulated signal acquisition illustrated in the above embodiments primarily are associated with increasing the detector sensitivity, improving the useful-signal resolution and background-light suppression. The system presented here produces a substantially larger useful signal swing in the detector than existing systems have been able to with the same amount of light. Thus, it will be possible in the future to obtain reliable distance and depth-card image capturers, particularly in security-relevant applications. The market segments mentioned in the introduction to the description will benefit from this.

It is not to be overlooked that the inventive accumulating of the output signal of a receiver, and/or—relating to the above embodiment—of the photocurrent of a photodiode over more than one time period of high sensitivity leads to the requirement that a larger energy store and/or a larger capacitor should be available given the same receiver or the same photodiode. Therefore, in the above embodiments, a capacitor having a capacitance in a range of more than 100 fF or several 100 fF is directly connected to the photodiodes.

The invention claimed is:

1. A device for detecting electromagnetic radiation, comprising
   a receiver which outputs an output signal in dependence on the electromagnetic radiation;
   a means for varying a sensitivity of the receiver;
   an energy store which is connectable to the receiver and whose stored energy is changed, in a connected state, in accordance with the output signal; and
   a control means for periodically resetting the energy store to a predetermined reference energy value, and for controlling the means for varying the sensitivity such that
   between two successive resetting events the sensitivity is high at least once and is low at least once,
   a state of the energy store giving an indication of the electromagnetic radiation,
   wherein the electromagnetic radiation is pulsed, and wherein the control means is configured to control the means for varying such that between two successive resetting events, the sensitivity is switched between high and low sensitivity, and that the switching is synchronized with pulse time periods during which the electromagnetic radiation is emitted.

2. The device as claimed in claim 1, wherein the receiver includes a semiconductor pn transition generating charge carriers in dependence on the electromagnetic radiation.

3. The device as claimed in claim 2, wherein the means for varying is a controllable voltage source for applying a variable cutoff voltage to the pn transition, the control means being configured to vary the voltage of the voltage source such that the space-charge region has a higher expansion for a high sensitivity than for a low sensitivity.

4. The device as claimed in claim 2, wherein the energy store is a capacitance which is charged or de-charged by a photocurrent generated in the pn transition.

5. The device as claimed in claim 4, wherein the capacitance includes a capacitor which is connectable to the pn transition such that same is de-charged by the photocurrent generated in the pn transition.

6. The device as claimed in claim 4, wherein the capacitance includes a barrier-layer capacitance of the pn transition which is charged by the photocurrent generated in the pn transition.

7. The device as claimed in claim 5, wherein the capacitor may be connected in series between the pn transition and the controllable voltage source.

8. The device as claimed in claim 1, further comprising
   a counterpart receiver, the receiver including a first pn transition which generates first charge carriers in dependence on the electromagnetic radiation, the counterpart receiver including a second pn transition which generates second charge carriers in dependence on the electromagnetic radiation;

a counterpart energy store, the energy store including a first capacitor, and the counterpart energy store including a second capacitor, the means for varying being a controllable voltage source for generating a variable voltage difference between a first voltage terminal and a second voltage terminal, and the first capacitor being connected, between the two successive resetting operations, between the first pn transition and the first voltage terminal, and the second capacitor being connected, between the two successive resetting operations, between the second pn transition and the second voltage terminal; and the control means being configured to simultaneously reset the first capacitor and the second capacitor and to control the controllable voltage source with one clock such that in subsequent clock cycles between the two successive resetting operations, a space-charge region of the first photodiode is larger, and a space-charge region of the second photodiode is smaller, at one time, and the other time, the space-charge region of the first photodiode is smaller, and the space-charge region of the second photodiode is larger.

9. The device as claimed in claim 2, further comprising: a shield for shielding the photodiode from the radiation having started interacting with the object and having an expansion around the pn transition which corresponds to the expansion of a space-charge region of the pn transition when same is in a state of low sensitivity.

10. The device as claimed in claim 1, wherein the receiver includes a pn transition and wherein a shielding structure is formed around the pn transition to drain off spurious charges in the receiver caused by interfering electromagnetic radiation in times between the pulse time durations.

11. A system for 3D-measuring of an object, comprising:
a pulsed light source for illuminating the object in a pulsed manner with pulsed electromagnetic radiation;
a plurality of devices for detecting electromagnetic radiation, each device comprising a receiver which outputs an output signal in dependence on the electromagnetic radiation; a means for varying a sensitivity of the receiver; an energy store which is connectable to the receiver and whose stored energy is changed, in a connected state, in accordance with the output signal; and a control means for periodically resetting the energy store to a predetermined reference energy value, and for controlling the means for varying the sensitivity such that between two successive resetting events the sensitivity is high at least once and is low at least once, a state of the energy store giving an indication of the electromagnetic radiation, wherein the electromagnetic radiation is pulsed, and wherein the control means is configured to control the means for varying such that between two successive resetting events, the sensitivity is switched between high and low sensitivity, and that the switching is synchronized with pulse time periods during which the electromagnetic radiation is emitted,
the receivers of which are arranged in a matrix, and the control means of which is configured to perform the synchronization of toggling with regard to the pulsed illumination of the pulsed light source;
an imaging means for imaging the object onto the matrix; and
an evaluation means for producing 3D information about the object on the basis of the states of the energy store of the plurality of devices.

12. The system as claimed in claim 11, wherein the evaluation means is configured to calculate, from the states of each energy store, the distance from a point on the object which is imaged onto the receiver of this energy store.

13. A method for operating a receiver for detecting pulsed electromagnetic radiation, comprising:
resetting an energy store which is connectable to a receiver, which outputs an output signal in dependence on the pulsed electromagnetic radiation, and the stored energy of which is changed, in a connected state, in accordance with the output signal;
varying a sensitivity of the receiver; and
periodically resetting the energy store to a predetermined reference energy value, and controlling the means for varying the sensitivity such that between two successive resetting events, the sensitivity is high at least once and is low at least once,
and that the resetting is synchronized with pulse periods in which the pulsed electromagnetic radiation is emitted,
a state of the energy store giving an indication of the pulsed electromagnetic radiation.

* * * * *